United States Patent [19]

Takanezawa et al.

[11] Patent Number: 5,419,946
[45] Date of Patent: May 30, 1995

[54] ADHESIVE FOR PRINTED WIRING BOARD AND PRODUCTION THEREOF

[75] Inventors: Shin Takanezawa; Teturou Irino; Yuuji Toshaka, all of Shimodate; Takashi Kagaya, Mooka, all of Japan

[73] Assignee: Hitachi Chemical Co., Ltd., Tokyo, Japan

[21] Appl. No.: 314,774

[22] Filed: Sep. 29, 1994

[30] Foreign Application Priority Data

Sep. 30, 1993 [JP] Japan .................................. 5-243455

[51] Int. Cl.6 ......................... B05D 5/12; B05D 3/10; B32B 5/16
[52] U.S. Cl. ....................................... 428/206; 427/98; 427/306; 428/355; 428/901; 524/508; 525/109; 525/152
[58] Field of Search ................... 427/98, 306; 428/206, 428/355, 901; 524/508; 525/109, 152

[56] References Cited

U.S. PATENT DOCUMENTS

| | | | |
|---|---|---|---|
| 3,691,289 | 9/1972 | Rohloff | 174/52 PE |
| 4,457,952 | 7/1984 | Kawamoto et al. | 427/98 |
| 5,053,280 | 10/1991 | Takanezawa et al. | 428/413 |
| 5,356,698 | 10/1994 | Kawamoto et al. | 428/209 |

*Primary Examiner*—Thomas Hamilton, III
*Attorney, Agent, or Firm*—Antonelli, Terry, Stout & Kraus

[57] ABSTRACT

An adhesive composition containing a special internal mold release agent obtained from tri-, di-, or mono-alkyl phosphoric ester, said alkyl moiety having 6 to 18 carbon atoms, and an amine in addition to major components of an epoxy resin, acrylonitrile-butadiene rubber, an alkylphenol resin, and an inorganic filler is suitable for producing printed wiring boards by an additive process excellent in adhesiveness to plated copper.

9 Claims, No Drawings

ADHESIVE FOR PRINTED WIRING BOARD AND PRODUCTION THEREOF

BACKGROUND OF THE INVENTION

This invention relates to an adhesive for printed wiring boards produced by an additive process excellent in adhesiveness to copper deposited by electroless plating, and a process for producing the printed wiring boards.

According to the additive process, a printed wiring board has been produced by forming necessary wiring patterns by electroless plating on an insulating substrate having an adhesive layer thereon. For example, an adhesive layer containing a catalyst is formed on an insulating substrate containing a catalyst or the like by an immersion method or a curtain coating and cured by heating at 150° to 190° C. for 30 to 60 minutes. Then, portions other than circuit forming portions are masked with a plating resist, and subjected to chemical roughening on the circuit forming portion surface of adhesive layer selectively with an oxidative etching solution such as chromic acid-sulfuric acid as a pre-treatment for improving the adhesiveness to electrolessly plated copper. After neutralization and water washing steps, the thus treated substrate is immersed in an electroless copper plating solution to deposit copper on the circuit portions. Thus a wiring pattern is formed.

As adhesives for printed wiring boards produced by the additive process, it is known to use as a major component acrylonitrile-butadiene rubber which is generally good in adhesiveness to plated copper, to crosslink the acrylonitrile-butadiene rubber with an alkylphenol resin so as to ensure heat resistance, and to mix with an epoxy resin so as to ensure electrical properties as disclosed in Japanese Paten Examined Publication (JP-B) Nos. 45-9843, 55-16391, H1-53910, Japanese Patent Unexamined Publication (JP-A) No. 48-24250 etc. Further, in order to reinforce an adhesive coated film and to increase roughness of adhesive surface at the time of chemical roughening (for improving adhesiveness to plated copper by an anchoring effect), it is proposed to blend an inorganic filler with the adhesive.

On the other hand, as a process for producing a laminate having an adhesive thereon, a process for forming an adhesive layer on an insulating substrate simultaneously at the time of molding the insulating substrate (hereinafter referred to as "one step method") is reconsidered recently comparing with a known process of using an insulating substrate as a starting material from the viewpoints of production cost, uniform film thickness, low surface roughness, and the like.

With recent miniaturization and multi-function of electronic devices, printed wiring boards are required to have an increased wiring density. Thus, the reduction of wiring width proceeds rapidly. For example, the wiring width of 150 μm was mainly 2 or 3 years ago, but now the wiring width of 100 μm becomes mainly. In the future, the wiring width will be 75 μm or 50 μm.

Under these circumstances, in printed wiring boards produced by the additive process according to either a conventional method or the one step method, the adhesiveness to plated copper becomes very important. But when the one step method is used, there takes place a phenomenon so-call "migration" wherein at the time of molding a prepreg containing a thermosetting resin and the adhesive into one body, the thermosetting resin contained in the prepreg is mixed at the time of pressing with heating. The migration brings about lowering of adhesive strength between the adhesive and electrolessly plated copper. Therefore, it is usually employed a method of carrying out curing of the adhesive sheet previously and pressed to the prepreg with heating. But, since curing proceeds considerably, the roughening becomes difficult, and the adhesive strength between the adhesive and electrolessly plated copper is lowered to about 70 to 80% of that of a conventional case of using the laminate having an adhesive thereon as a starting material.

SUMMARY OF THE INVENTION

It is an object of the present invention to provide an adhesive composition for printed wiring boards produced by an additive process having high adhesiveness to plated copper, and a process for producing a printed wiring board by an additive process.

The present invention provides an adhesive composition for printed wiring boards produced by an additive process comprising an epoxy resin, acrylonitrile-butadiene rubber, an alkylphenol resin, and an inorganic filler in a total amount of 100 parts by weight as major components and 0.05 to 5.0% by weight of an internal mold release agent obtained from a tri-, di- or mono-alkyl phosphoric ester having at least one alkyl group with 6 to 18 carbon atoms, and an amine.

DESCRIPTION OF THE PREFERRED EMBODIMENTS

The adhesive composition of the present invention comprises as major components an epoxy resin, acrylonitrile-butadiene rubber, an alkylphenol resin and an inorganic filler in a total amount of 100 parts by weight and 0.05 to 5.0% by weight of an internal mold release agent obtained from a tri-, di- or mono-alkyl phosphoric ester, said alkyl moiety having 6 to 18 carbon atoms, and an amine.

The internal mold release agent can be selected from those used for releasing a paper phenol laminate from flat panels (stainless steel-made flat panels) in the production of the paper phenol laminate by thermal press contact bonding.

Such an internal mold release agent can be obtained from a tri-, di- or mono-alkyl phosphoric ester, said alkyl moiety having 6 to 18 carbon atoms, such as tri-, di- or monostearyl phosphoric ester, tri, di- or monooctylphosphoric ester, tri-, di- or monolaurylphosphoric ester, etc. and a primary, secondary or tertially amine such monoethanolamine, diethanolamine, triethanolamine, monoethylamine, diethylamine, triethylamine, etc. The tri-, di- or mono-alkyl phosphoric ester can be obtained by reacting a primary, secondary or tertially aliphatic alcohol having a various carbon number in the alkyl moiety with phosphoric acid.

The molecular weight of the internal mold release agent can be controlled by the carbon number of alkyl moiety and the number of alkyl moiety of ester linkage with phosphoric acid.

Concrete examples of the internal mold release agent are monostearylphosphoric ester triethanolamine, distearylphosphoric ester monoethanolamine, dioctylphosphoric ester monoethanolamine, trioctylphosphoric ester monoethanolamine, trilaurylphosphoric ester triethanolamine, trilaurylphosphoric ester triethylamine salt, monolaurylphosphoric ester diethanolamine, didodecylphosphoric ester monoethanolamine, monopentadecylphosphoric ester triethanolamine, etc.

The amount of the internal mold release agent is 0.05 to 5.0% by weight based on 100 parts by weight of a total of major components, i.e. an epoxy resin, acrylonitrile-butadiene rubber, an alkylphenol resin and an inorganic filler. When the amount is less than 0.05% by weight, the effect for improving the adhesiveness to plated copper becomes small, while when the amount is more than 5.0% by weight, heat resistance is lowered.

As the epoxy resin, there can be used bisphenol A type, novolak type, bisphenol F type and alicyclic type epoxy resins. Considering heat resistance and resistance to plating solution, bisphenol A epoxy resins and novolak epoxy resin are preferable.

The epoxy resin is preferably used in an amount of 10 to 65% by weight based on the total weight of the major components. When the amount is less than 10% by weight, there is a tendency to lower heat resistance, while when the amount is more than 65% by weight, there is a tendency to lower adhesiveness to plated copper.

As a curing agent for the epoxy resin, there can be used conventional latent curing agents for epoxy resins such as imidazoles, amines, phenolic compounds, dicyandiamide, etc.

As the acrylonitrile-butadiene rubber, there can be used those having acrylonitrile preferably in an amount of 15 to 50% by weight. When the content of acrylonitrile is less than 15% by weight, there is a tendency to lower compatibility with other components of the adhesive composition. On the other hand, when the content of acrylonitrile is more than 50% by weight, there is a tendency to lower insulating properties due to easy water absorption. It is also possible to use acrylonitrile-butadiene rubber containing carboxyl groups.

The acrylonitrile-butadiene rubber is preferably used in an amount of 10 to 60% by weight based on the total weight of the major components. When the amount is less than 10% by weight, there is a tendency to lower film forming properties and soughening properties, while when the amount is more than 60% by weight, there is a tendency to lower heat resistance.

The alkylphenol resin is used for thermal crosslinking of the acrylonitrile-butadiene rubber. As the alkylphenol resin, there can be used those having various alkyl groups, various kinds of reactive groups and various molecular weights. Preferable examples of the alkylphenol is p-tert-butylphenol, p-tert-amylphenol, p-phenylphenol, and p-sec-butylphenol.

The alkylphenol resin is preferably used in an amount of 2 to 30% by weight based on the total weight of the major components. When the amount is less than 2% by weight, there is a tendency to give insufficient heat resistance, while when the amount is more than 30% by weight, there is a tendency to lower adhesiveness to plated copper due to insufficient roughening.

As the inorganic filler, there can be used calcium carbonate, magnesium silicate, aluminum silicate, aluminum hydroxide, fired hydrotalcite, silicon dioxide, etc. These inorganic fillers can be used singly or as a mixture thereof.

The inorganic filler is preferably used in an amount of 10 to 50% by weight based on the total weight of the major components. When the amount is less than 10% by weight, there is a tendency to make both roughening properties and heat resistance insufficient, while when the amount is more than 50% by weight, roughening properties and heat resistance are not improved and there is no economical advantage.

The adhesive composition may contain a plating catalyst which becomes nuclei for deposition of electroless copper plating.

As the plating catalyst, there can be used salts of metals belonging to the Groups VIII, IB and IIB of the periodic table. For example, compounds of platinum, palladium, tin, etc. can be used. The plating catalyst can be included in the adhesive composition in the form of solid particles, a solution dissolved in an organic solvent, or a dispersion together with other resin.

The plating catalyst is used in an amount of preferably 2 to 15% by weight based on the weight of the adhesive composition. When the amount is less than 2% by weight, no copper is deposited by electroless plating, while when the amount is more than 15% by weight, insulating properties are lowered and there is no economical merit.

The adhesive composition is used in the form of a solution obtained by kneading in an organic solvent. As the organic solvent, there can be used toluene, methyl ethyl ketone, acetone, methyl isobutyl ketone, xylene, diethylene glycol monomethyl ether, diethylene glycol monomethyl ether acetate, ethyl acetate, etc. These organic solvent can be used singly or as a mixture thereof.

The adhesive composition can be coated on a surface of insulating substrate by the following two methods (A) and (B).

Method (A):

A first method is to produce an insulating substrate having adhesive layers on both sides of the insulating substrate by coating a solution of the adhesive composition on a releasable support, drying the adhesive composition to give an adhesive sheet, placing the adhesive sheet on both sides of a prepreg impregnated with a thermosetting resin and molding into one piece with heating under pressure.

As the releasable support, there can be used metal foils such as aluminum foil, copper foil, etc. subjected to release treatment, plastic films such as polypropylene film, polyethylene film, triacetate film, polyester film, fluorinated vinyl polymer film, etc. subjected to release treatment.

On the releasable support, the solution of adhesive composition is coated, for example, in a thickness of 20 to 120 μm and dried at 120° C. to 180° C. for 2 to 20 minutes, followed by preliminary curing.

The resulting adhesive layer is peeled off from the releasable support to give an adhesive sheet, which is then place on a prepreg obtained by impregnating an inorganic or organic substrate, or a substrate of a complex of inorganic and organic materials with a thermosetting resin (e.g. an epoxy resin, a phenol resin, a polyimide resin, etc.) and molded into one piece with heating under pressure.

Preferable molding conditions are a molding temperature of 140° C. to 200° C., a pressure of 20 to 100 Kg/cm$^2$ and a time of 30 to 120 minutes. When the temperature in lower than 140° C., moldability becomes insufficient, while when the temperature is higher than 200° C., warpage, discoloration and the like tend to take place. Further, when the time is less than 30 minutes, the moldability becomes insufficient, while when the time is more than 120 minutes, roughening becomes difficult due to undesirably proceeded curing.

Method (B):

A second method is to produce a laminate having adhesive layers on both sides by piling a predetermined number of prepregs obtained by impregnating an inorganic or organic substrate or a complex substrate made of inorganic and organic materials with a thermosetting resin (e.g. an epoxy resin, a phenol resin, a polyimide resin, etc.) and molded with heating under pressure to give an insulating substrate, on which the adhesive composition solution is coated by an immersion method or a curtain coating, followed by drying.

The adhesive composition is dried with heating at a temperature of 100° C. to 150° C. for 15 to 45 minutes, followed by preliminary curing at 150° C. to 200° C. for 30 to 90 minutes.

The thickness of the adhesive composition is preferably in the range of 20 to 50 µm. When the thickness is less than 20 µm, adhesiveness to plated copper is lowered, while when the thickness is more than 50 µm, there is no economical merit due to an increase of using amount of adhesive composition.

The insulating substrate may contain the same plating catalyst for electroless plating as used in the adhesive composition. The amount of the plating catalyst is preferably 2 to 15% by weight with the same reasons as in the case of adhesive composition.

Before deposition of electroless plating, the surface of adhesive layer is chemically roughened so as to make the surface state suitable for adhesion.

As the treating solution for chemical roughening, there can be used chromic acid-sulfuric acid, chromic acid-sulfuric acid-sodium fluoride, borofluoric acid-bichromic acid, alkali permanganate, etc.

As the electroless plating bath, there can be used conventional ones which can form a copper plated film.

Drilling of a wiring board for mounting electronic parts and connecting conductors can be carried out using a punch press, an NC drill machine, etc.

Pattern formation is carried out by a conventional method, for example, a plating resist is formed by screen printing, and ultraviolet curing is carried out through a photomask, followed by a conventional development.

The formation of plating resist can be carried out before or after chemical roughening treating step.

According to the present invention, since the adhesive composition contains an internal mold release agent obtained from tri-, di- or mono-alkyl phosphoric ester, said alkyl moiety having 6 to 18 carbon atoms, and an amine in addition to the major components of an epoxy resin, acrylonitrile-butadiene rubber, an alkylphenol resin and an inorganic filler, it can effectively be used for producing printed wiring boards by the additive process with excellent adhesiveness to plated copper.

Reasons for improvement of adhesiveness by the special internal mold release agent are not so clear, but migration of hydrophilic groups to resin surface side by the action of mold release agent at high temperatures during curing seems to increase chemical bonding strength between the hydrophilic groups appeared on the surface of adhesive layer and plated copper deposited on the surface of adhesive layer in the adhesive used in the additive process-made printed wiring board.

The present invention is illustrated by way of the following Examples, in which all parts and % are by weight, unless otherwise specified.

EXAMPLES 1-6 AND COMPARATIVE EXAMPLES 1-2

| | |
|---|---|
| Bisphenol A type epoxy resin | 15 parts |
| Epikote 1001 (a trade name, mfd. by Yuka Shell Epoxy Co., Ltd.) | |
| Acrylonitrile-butadiene rubber | 50 parts |
| Nipole 1031 (a trade name, mfd. by Japanese Geon Co.) | |
| Alkylphenol resin | 10 parts |
| Hitanol 2400 (a trade name, mfd. by Hitachi Chemical Co., Ltd.) | |
| Inorganic filler (zirconium silicate) | 20 parts |
| Micropacks (a trade name, mfd. by Hakusui Kagaku K.K.) | |
| Curing agent for epoxy resin | 0.1 part |
| 2-ethyl-4-methylimidazole | |
| Plating catalyst for electroless plating | 4 parts |
| a resin mixture of palladium chloride | |

The above-mentioned ingredients were kneaded in a kneader with 0.5 part of an internal mold release agent having a different carbon number in the alkyl group(s) in phosphoric ester as shown in Table 1 and dissolved in methyl ethyl ketone to give an adhesive composition solution having a solid content of 20%.

Using the resulting adhesive composition solution, laminates having adhesive layers on both sides of laminate were produced by the one step method (Process-1) and the immersion method (Process-2).

Process-1

The one step method was carried out as follows.

An adhesion composition solution was coated on one surface of a polyester film of 75 µm thick subjected to releasing treatment on both sides in a film thickness of 40 µm and heat treated at 170° C. for minutes to give an adhesive film. A predetermined number of prepregs GE-168 (a trade name, mfd. by Hitachi Chemical Co., Ltd.), each obtained by impregnating glass cloth of 0.2 mm thick with an epoxy resin containing a plating catalyst and semi-curing it, were piled while placing the adhesive film on both outermost surfaces of the prepregs, followed by molding between flat panels at 170° C. under 50 kg/cm² for 60 minutes to give a laminate (insulating substrate) having adhesive layers on both sides.

Process-2

The immersion method was carried out as follows.

An adhesive composition solution was subjected to adjustment of viscosity. On the other hand, a predetermined number of prepregs GE-168 (a trade name, mfd. by Hitachi Chemical Co., Ltd.), each obtained by impregnating glass cloth of 0.2 mm thick with an epoxy resin containing a plating catalyst and semi-curing it, were piled and molded between flat panels via mold release films at 170° C. under 50 kg/cm² for 60 minutes to give a laminate (commercially available under a trade name of LE-168, mfd. by Hitachi Chemical Co., Ltd.).

The resulting laminate was immersed in the above-mentioned adhesive composition solution and pulled up at a rate of 10 mm/min to give a film thickness of 25 µm. After heat treating at 120° C. for 30 minutes, curing was carried out at 170° C. for 60 minutes to give a laminate (insulating substrate) having adhesive layers on both sides.

On each insulating substrate having adhesive layers thereon, a pair of resists for plating (SR-3000, a trade name, mfd. by Hitachi Chemical Co., Ltd.) were laminated thereon, exposed to ultraviolet light, and developed to form a test pattern.

The resulting laminate was immersed in a roughening solution of chromic acid/sulfuric acid/sodium fluoride (chromic acid 40 g/liter, conc. sulfuric acid 300 ml/liter, sodium fluoride 10 g/liter) at 40° C. for 10 minutes to chemically roughen exposed portions of the adhesive layers selectively, followed by neutralization and washing with water.

The thus treated laminate was placed in an electroless plating bath (CC-41 solution, a trade name, mfd. by Hitachi Chemical Co., Ltd.) to deposit plated copper in 35 μm thickness, followed by annealing at 160° C. for 60 minutes to give an additive process-made printed wiring board.

Test patterns were also produced in the same manner as mentioned above except for not using an internal mold release agent (Comparative Examples 1 and 2).

The resulting test patterns (samples) were subjected to the following tests.

(a) Adhesiveness to plated copper

A plated copper foil was etched to give 10 mm wide lines and the rest was removed. The resulting plated copper was peeled at an angle of 90° to evaluate peel strength according to JIS C-6481.

(b) Solder heat resistance

A sample of 25 mm square was floated on a solder bath heated at 260° C. and a time required for generating blisters was measured according to JIS C-6481.

(c) Surface resistance

A resistance value was measured when a direct current voltage of 100 V was applied to a sample having a wiring width/wiring distance of 0.1 mm/0.1 mm.

The results are shown in Table 1.

TABLE 1

| Example No. | Internal mold release agent | Process | Adhesiveness to plated copper (KN/m) | Solder heat resistance (sec) | Surface resistance (Ω) |
|---|---|---|---|---|---|
| Example 1 | Monostearylphosphoric ester triethanolamine | 1 | 2.0 | >60 | $2.3 \times 10^{13}$ |
| Example 2 | Monostearyl phosphoric ester triethanolamine | 2 | 2.2 | >60 | $1.3 \times 10^{13}$ |
| Example 3 | Dioctylphosphoric ester monoethanolamine | 1 | 2.1 | >60 | $1.9 \times 10^{13}$ |
| Example 4 | Dioctylphosphoric ester monoethanolamine | 2 | 2.2 | >60 | $1.1 \times 10^{12}$ |
| Example 5 | Trilaurylphosphoric ester triethylamine | 1 | 2.0 | >60 | $2.4 \times 10^{13}$ |
| Example 6 | Trilaurylphosphoric ester triethylamine | 2 | 2.1 | >60 | $1.3 \times 10^{13}$ |
| Comparative Example 1 | None | 1 | 1.6 | >60 | $2.2 \times 10^{13}$ |
| Comparative Example 2 | None | 2 | 1.7 | >60 | $1.3 \times 10^{13}$ |

As explained above, by adding the special internal mold release agent to major components of adhesive composition comprising an epoxy resin, acrylonitrile-butadiene rubber, an alkylphenol resin and an inorganic filler, printed wiring boards produced by additive process improve adhesiveness of the adhesive composition formed on an insulating substrate to plated copper remarkably without lowering heat resistance and electrical properties.

What is claimed is:

1. An adhesive composition for printed wiring board produced by an additive process comprising an epoxy resin, acrylonitrile-butadiene rubber, an alkylphenol resin, and an inorganic filler as major components, and 0.05 to 5.0% by weight of an internal mold release agent obtained from tri-, di-, or mono-alkyl phosphoric ester having one or more alkyl moieties with 6 to 18 carbon atoms, and an amine based on 100 parts by weight of the major components.

2. An adhesive composition according to claim 1, wherein the major components comprises 10 to 65% by weight of an epoxy resin, 10 to 60% by weight of an acrylonitrile-butadiene rubber, 2 to 30% by weight of an alkylphenol resin, and 10 to 50% by weight of an inorganic filler, a total being 100% by weight.

3. An adhesive sheet obtained by coating a solution of the adhesive composition of claim 1 on a releasable support and drying.

4. A laminate having adhesive layers thereon obtained by coating a solution of the adhesive composition of claim 1 on circuit formation areas.

5. A laminate having adhesive layers on circuit formation areas obtained by placing the adhesive sheet of claim 3 on both sides of a prepreg impregnated with a thermosetting resin and molding integrally at 140° to 200° C. under a pressure of 20 to 100 kg/cm² for 30 to 120 minutes.

6. A laminate having adhesive layers thereon obtained by coating a solution of the adhesive composition of claim 1 on circuit formation areas by an immersion method or a curtain coating method.

7. A process for producing a printed wiring board, which comprises drilling through-holes in the laminate of claim 4, forming a plating resist thereon, roughening the surface thereof, and conducting electroless plating.

8. A process for producing a printed wiring board, which comprises drilling through-holes in the laminate of claim 5, forming a plating resist thereon, roughening the surface thereof, and conducting electroless plating.

9. A process for producing a printed wiring board, which comprises drilling through-holes in the laminate of claim 6, forming a plating resist thereon, roughening the surface thereof, and conducting electroless plating.

* * * * *